United States Patent
Tran et al.

(10) Patent No.: US 9,613,973 B2
(45) Date of Patent: Apr. 4, 2017

(54) MEMORY HAVING A CONTINUOUS CHANNEL

(71) Applicant: Micron Technology, Inc., Boise, ID (US)

(72) Inventors: Luan C. Tran, Meridian, ID (US); Hongbin Zhu, Boise, ID (US); John D. Hopkins, Boise, ID (US); Yushi Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/831,011

(22) Filed: Aug. 20, 2015

(65) Prior Publication Data
US 2016/0099252 A1    Apr. 7, 2016

Related U.S. Application Data

(60) Provisional application No. 62/059,321, filed on Oct. 3, 2014.

(51) Int. Cl.
| | | |
|---|---|---|
| *H01L 21/8234* | (2006.01) | |
| *H01L 21/8238* | (2006.01) | |
| *H01L 27/115* | (2006.01) | |
| *H01L 27/11556* | (2017.01) | |
| *H01L 27/11582* | (2017.01) | |

(52) U.S. Cl.
CPC ......... *H01L 27/11556* (2013.01); *H01L 21/823487* (2013.01); *H01L 21/823885* (2013.01); *H01L 27/11582* (2013.01)

(58) Field of Classification Search
CPC ..... H01L 21/823487; H01L 21/823885; H01L 27/11556; H01L 27/11582
See application file for complete search history.

(56) References Cited

U.S. PATENT DOCUMENTS

| | | | |
|---|---|---|---|
| 7,425,742 B2 | 9/2008 | Nazarian | |
| 7,598,565 B2 | 10/2009 | Kato | |
| 8,780,642 B2 | 7/2014 | Widjaja et al. | |
| 2014/0029345 A1* | 1/2014 | Goda | G11C 16/10 365/185.18 |
| 2014/0061750 A1* | 3/2014 | Kwon | H01L 27/1052 257/314 |

* cited by examiner

*Primary Examiner* — Phat X Cao
(74) *Attorney, Agent, or Firm* — Brooks, Cameron & Huebsch, PLLC

(57) ABSTRACT

The present disclosure includes memory having a continuous channel, and methods of processing the same. A number of embodiments include forming a vertical stack having memory cells connected in series between a source select gate and a drain select gate, wherein forming the vertical stack includes forming a continuous channel for the source select gate, the memory cells, and the drain select gate, and removing a portion of the continuous channel for the drain select gate such that the continuous channel is thinner for the drain select gate than for the memory cells and the source select gate.

24 Claims, 9 Drawing Sheets

MEMORY HAVING A CONTINUOUS CHANNEL

PRIORITY INFORMATION

This application is a Non-Provisional of U.S. Provisional Application No. 62/059,321, dated Oct. 3, 2014, the contents of which are included herein by reference.

TECHNICAL FIELD

The present disclosure relates generally to semiconductor memory and methods, and more particularly, to memory having a continuous channel and methods of processing the same.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices may use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

In a three-dimensional (3D) memory device, such as a 3D NAND flash memory device, the memory cells may be vertically stacked (e.g., a first cell may be stacked on top of a second cell, a second cell may be stacked on top of a third cell, etc.) and connected in series between a source select gate (SGS) and a drain select gate (SGD). Vertically stacking the memory cells in such a manner can reduce the size (e.g., area) of the memory device and/or increase the density of the device.

DETAILED DESCRIPTION

Figure 1A:
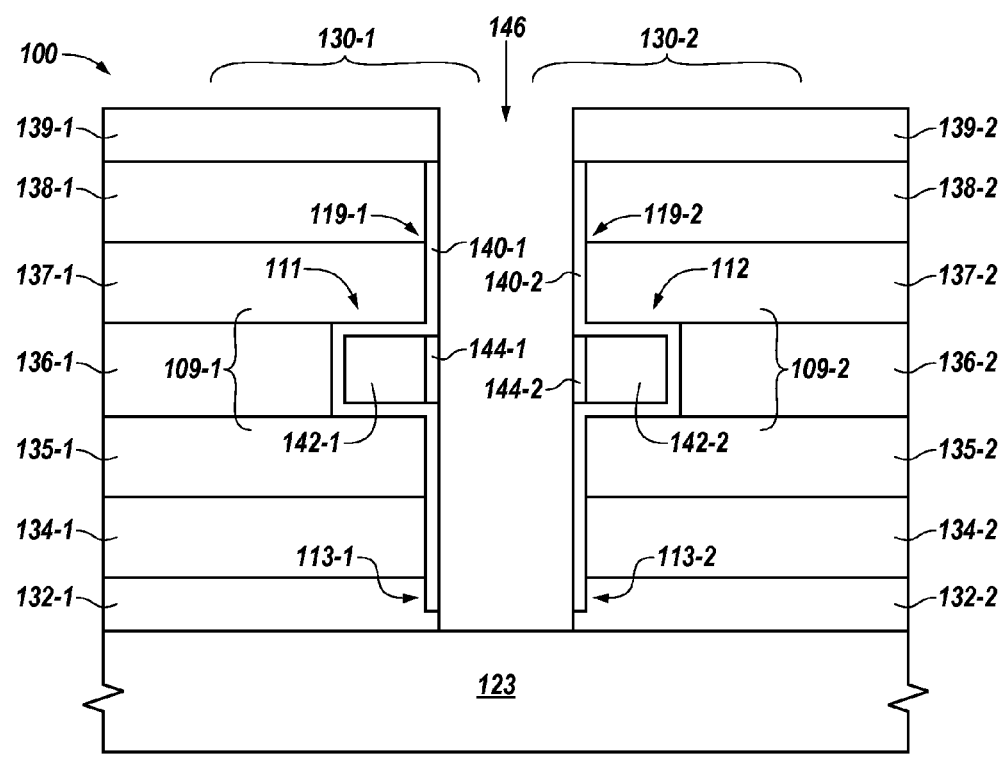
FIGS. 1A-1F illustrate process steps associated with forming an apparatus in the form of a memory device in accordance with a number of embodiments of the present disclosure.

The present disclosure includes memory having a continuous channel, and methods of processing the same. A number of embodiments include forming a vertical stack having memory cells connected in series between a source select gate and a drain select gate, wherein forming the vertical stack includes forming a continuous channel for the source select gate, the memory cells, and the drain select gate, and removing a portion of the continuous channel for the drain select gate such that the continuous channel is thinner for the drain select gate than for the memory cells and the source select gate.

In memory processed in accordance with the present disclosure (e.g., vertically stacked memory in which the channel is thinner and/or has a different doping concentration for the drain select gate than for the memory cells and source select gate), it may be easier to turn off the drain select gate during operation (e.g., programming, sensing, and/or erasing) of the memory than for memory processed in accordance with previous approaches (e.g., memory in which the channel is the same thickness and/or has the same doping concentration for the drain select gate, memory cells, and source select gate). Making it easier to turn off the drain select gate during operation of the memory can increase the efficiency, performance (e.g., speed) and/or accuracy of the memory.

As used herein, "a number of" something can refer to one or more such things. For example, a number of memory cells can refer to one or more memory cells. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 123 may reference element "23" in FIGS. 1A-1F, and a similar element may be referenced as 223 in FIGS. 2A-2B and 323 in FIG. 3.

FIGS. 1A-1F illustrate process steps associated with forming an apparatus in the form of a memory device 100 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

FIG. 1A illustrates a schematic cross-sectional view of vertical stacks 130-1 and 130-2 formed (e.g., deposited) on a common source 123. Although two vertical stacks are illustrated in FIG. 1A, embodiments of the present disclosure are not limited to a particular number of vertical stacks. For example, memory device 100 can include any number of vertical stacks analogous to vertical stacks 130-1 and 130-2.

As shown in FIG. 1A, vertical stack 130-1 includes an oxide material 132-1 formed on common source 123, a gate material 134-1 formed on oxide material 132-1, an insulator material 135-1 formed on gate material 134-1, a conductor material 136-1 formed on insulator material 135-1, an insulator material 137-1 formed on conductor material 136-1, a gate material 138-1 formed on insulator material 137-1, and a cap material 139-1 formed on gate material 138-1. Vertical stack 130-2 includes an oxide material 132-2 formed on common source 123, a gate material 134-2 formed on oxide material 132-2, an insulator material 135-2 formed on gate material 134-2, a conductor material 136-2 formed on insulator material 135-2, an insulator material 137-2 formed on conductor material 136-2, a gate material 138-2 formed on insulator material 137-2, and a cap material 139-2 formed on gate material 138-2, as illustrated in FIG. 1A.

Gate materials 134-1, 134-2, 138-1, and 138-2 can be a conductor material, such as, for instance, doped silicon (e.g., polysilicon). In a number of embodiments, gate materials 134-1 and 134-2 can be the same as gate materials 138-1 and 138-2. Insulator materials 135-1, 137-2, 135-2, and 137-2 can be a dielectric material, such as, for instance, an oxide (e.g., silicon dioxide ($SiO_2$)). Conductor materials 136-1 and 136-2 can be, for instance, doped silicon (e.g., polysilicon). Cap materials 139-1 and 139-2 can be, for instance, a nitride. However, embodiments of the present disclosure are not limited to a particular type of gate material(s), insulator material(s), conductor material(s), or cap material(s).

As shown in FIG. 1A, vertical stack 130-1 includes an oxide material 140-1 formed adjacent oxide material 132-1, gate material 134-1, insulator material 135-1, conductor material 136-1, insulator material 137-1, and gate material 138-1. Vertical stack 130-2 includes an oxide material 140-2 adjacent oxide material 132-2, gate material 134-2, insulator material 135-2, conductor material 136-2, insulator material 137-2, and gate material 138-2, as illustrated in FIG. 1A. In a number of embodiments, oxide materials 140-1 and 140-2 can be the same as oxide materials 132-1 and 132-2. Forming oxide materials 140-1 and 140-2 adjacent conductor materials 136-1 and 136-2, respectively, can include, for example, removing (e.g., etching and/or patterning) portions of conductor materials 136-1 and 136-2 to form respective recesses therein, and forming oxide materials 140-1 and 140-2 in the respective recesses such that oxide materials 140-1 and 140-2 partially fill the respective recesses, as illustrated in FIG. 1A.

As shown in FIG. 1A, vertical stack 130-1 includes a control gate material 142-1 and a charge storage structure (e.g., floating gate) material 144-1 formed in the remaining portion of the recess in conductor material 136-1 such that control gate material 142-1 is adjacent the three sides of oxide material 140-1 in the recess and charge storage structure material 144-1 is adjacent control gate material 142-1 and opposite sides of oxide material 140-1 in the recess. Vertical stack 130-2 includes a control gate material 142-2 and a charge storage structure (e.g., floating gate) material 144-2 formed in the remaining portion of the recess in conductor material 136-2 such that control gate material 142-2 is adjacent the three sides of oxide material 140-2 in the recess and charge storage structure material 144-2 is adjacent control gate material 142-2 and opposite sides of oxide material 140-2 in the recess. In a number of embodiments, control gate materials 142-1 and 142-2 can be the same as gate materials 134-1, 134-2, 138-1, and 138-2, and floating gate materials 144-1 and 144-2 can be a different material than control gate materials 142-1 and 142-2. Further, although not shown in FIG. 1A for clarity and so as not to obscure embodiments of the present disclosure, an insulator material may be present between (e.g., separate) control gate material 142-1 and charge storage structure material 144-1, and an insulator material may be present between control gate material 142-2 and charge storage structure material 144-2.

In the example illustrated in FIG. 1A, a portion of oxide material 132-1, a portion of gate material 134-1, and a portion of oxide material 140-1 adjacent oxide material 132-1 and gate material 134-1 can form a source select gate (SGS) 113-1. Further, a portion of gate material 138-1, a portion of insulator material 137-1, and a portion of oxide material 140-1 adjacent gate material 138-1 and insulator material 137-1 can form a drain select gate (SGD) 119-1. Further, a portion of conductor material 136-1, a portion of oxide material 140-1 adjacent conductor material 136-1, control gate material 142-1, and charge storage structure material 144-1 can form a memory cell 111. That is, vertical stack 130-1 can include memory cell 111 connected in series between SGS 113-1 and SGD 119-1.

Additionally, a portion of oxide material 132-2, a portion of gate material 134-2, and a portion of oxide material 140-2 adjacent oxide material 132-2 and gate material 134-2 can form SGS 113-2. Further, a portion of gate material 138-2, a portion of insulator material 137-2, and a portion of oxide material 140-2 adjacent gate material 138-2 and insulator material 137-2 can form SGD 119-2. Further, a portion of conductor material 136-2, a portion of oxide material 140-2 adjacent conductor material 136-2, control gate material 142-2, and charge storage structure material 144-2 can form a memory cell 112. That is, vertical stack 130-2 can include memory cell 112 connected in series between SGS 113-2 and SGD 119-2.

In the example illustrated in FIG. 1A, memory cell 111 can be part of a string 109-1 of memory cells connected in series between SGS 113-1 and SGD 119-1, and memory cell 112 can be part of a string 109-2 of memory cells connected in series between SGS 113-2 and SGD 119-2. That is, vertical stack 130-1 can include a string 109-1 of memory cells connected in series between SGS 113-1 and SGD 119-1, and vertical stack 130-2 can include a string 109-2 of memory cells connected in series between SGS 113-2 and SGD 119-2. For clarity and simplicity, strings 109-1 and 109-2 illustrated in FIG. 1A include one memory cell (e.g., cell 111 and 112, respectively). However, embodiments of the present disclosure are not so limited. For example, strings 109-1 and 109-2 can include any number of memory cells connected in series between SGS 113-1 and SGD 119-1 and SGS 113-2 and SGD 119-2, respectively.

As shown in FIG. 1A, memory device 100 can include an opening 146. Oxide material 140-1 and charge storage structure material 144-1 can be adjacent one side of opening 146, oxide material 140-2 and charge storage structure material 144-2 can be adjacent the opposite side of opening 146, and common source 123 can be adjacent the bottom of opening 146, as illustrated in FIG. 1A. As such, vertical stack 130-1 can include a portion of opening 146 (e.g., the side of opening 146 adjacent oxide material 140-1 and charge storage structure material 144-1), and vertical stack 130-2 can include a portion of opening 146 (e.g., the side of opening 146 adjacent oxide material 140-2 and charge storage structure material 144-2).

Figure 1B:
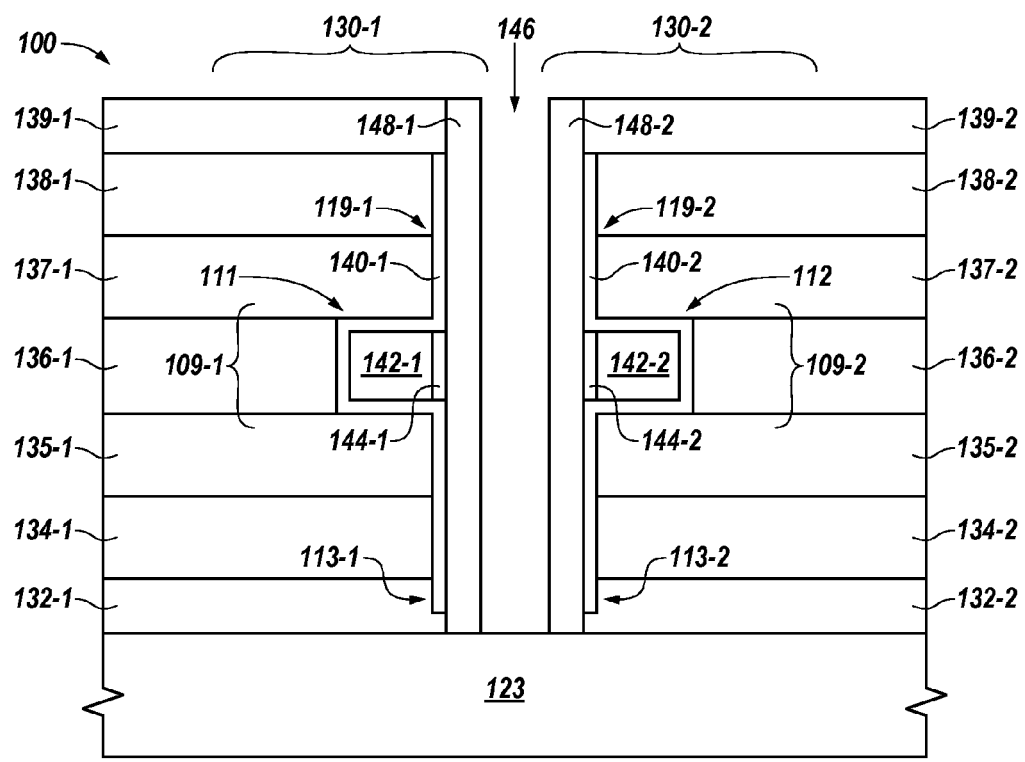

FIG. 1B illustrates a schematic cross-sectional view of the structure shown in FIG. 1A after a subsequent processing step. In FIG. 1B, a continuous channel 148-1 for SGS 113-1, string 109-1 (e.g., memory cell 111), and SGD 119-1 is formed in opening 146 adjacent oxide material 140-1 and charge storage structure material 144-1. Further, a continuous channel 148-2 for SGS 113-2, string 109-2 (e.g., memory cell 112), and SGD 119-2 is formed in opening 146 adjacent oxide material 140-2 and charge storage structure material 144-2, as illustrated in FIG. 1B. That is, vertical stack 130-1 includes a continuous channel 148-1 for SGS 113-1, string 109-1, and SGD 119-1, and vertical stack 130-2 includes a continuous channel 148-2 for SGS 113-2, string 109-2, and SGD 119-2, as illustrated in FIG. 1B.

As shown in FIG. 1B, continuous channels 148-1 and 148-2 are formed such that they partially fill opening 146. For example, continuous channels 148-1 and 148-2 are formed in opening 146 such that one side of opening 146 illustrated in FIG. 1B is adjacent continuous channel 148-1, and the opposite side of opening 146 illustrated in FIG. 1B is adjacent continuous channel 148-2.

In a number of embodiments, continuous channels 148-1 and 148-2 can be conformally formed (e.g., conformally deposited) in opening 146. Further, continuous channel 148-1 can be formed concurrently (e.g., at the same time) for SGS 113-1, string 109-1, and SGD 119-1, and continuous channel 148-2 can be formed concurrently for SGS 113-2, string 109-2, and SGD 119-2. Continuous channels 148-1 and 148-2 can be hollow or solid p-type materials.

Figure 1C:
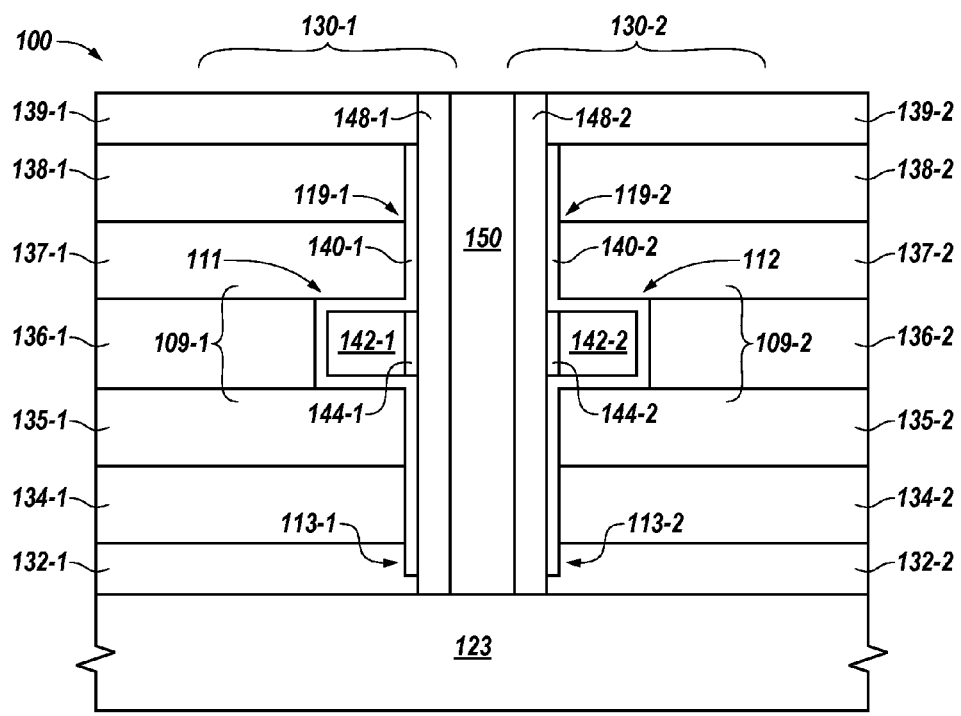

FIG. 1C illustrates a schematic cross-sectional view of the structure shown in FIG. 1B after a subsequent processing step. In FIG. 1C, material 150 is formed in the remaining portion of opening 146 adjacent continuous channels 148-1 and 148-2 (e.g., adjacent the back sides of continuous channels 148-1 and 148-2) and common source 123 such that material 150 completely fills the remaining portion of opening 146. As such, vertical stack 130-1 can include a portion of material 150 (e.g., the side of material 150 adjacent continuous channel 148-1), and vertical stack 130-2 can include a portion of material 150 (e.g., the side of material 150 adjacent continuous channel 148-2). Material 150 can be, for example, a dielectric material such as a spin on dielectric (SOD) material, or an oxide material such as a flowable oxide material.

Figure 1D:
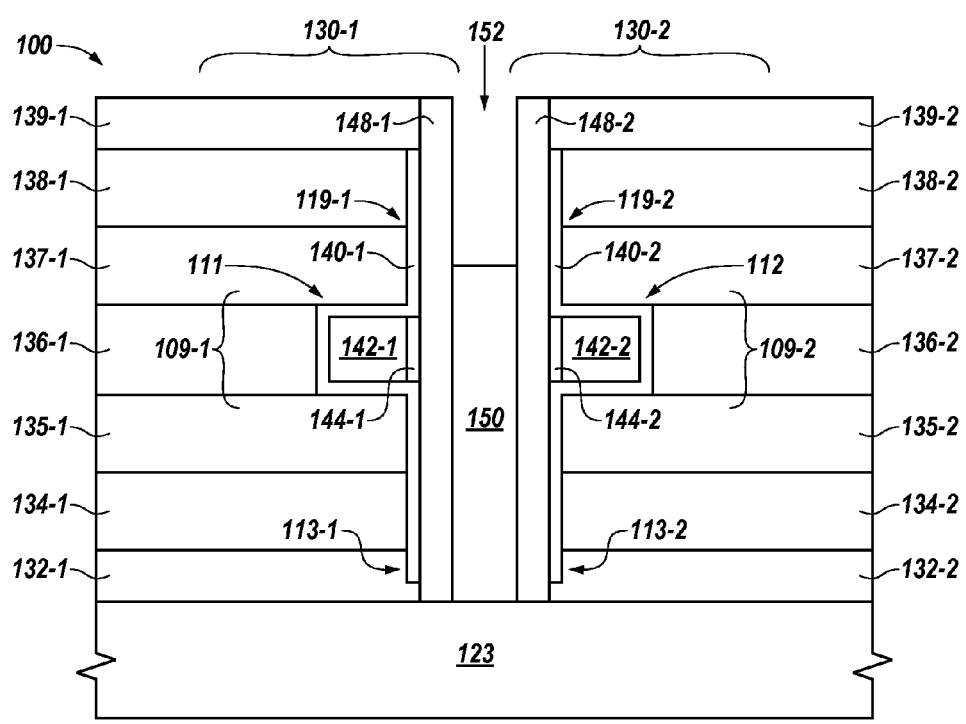

FIG. 1D illustrates a schematic cross-sectional view of the structure shown in FIG. 1C after a subsequent processing step. In FIG. 1D, the portion of material 150 adjacent the portions of continuous channels 148-1 and 148-2 for SGDs 119-1 and 119-2, respectively, is removed to form opening 152. That is, the portion of continuous channel 148-1 for SGD 119-1 can be adjacent one side of opening 152, and the portion of continuous channel 148-2 for SGD 119-2 can be adjacent the opposite side of opening 152, as illustrated in FIG. 1D. As such, vertical stack 130-1 can include a portion of opening 152 (e.g., the side of opening 152 adjacent the portion of continuous channel 148-1 for SGD 119-1), and vertical stack 130-2 can include a portion of opening 152 (e.g., the side of opening 152 adjacent the portion of continuous channel 148-2 for SGD 119-2). The portion of material 150 can be removed (e.g., etched and/or patterned) using, for example, a controlled, diluted solution, such as a tetramethylammonium hydroxide (TMAH) solution.

As shown in FIG. 1D, only the portion of material 150 adjacent the portions of continuous channels 148-1 and 148-2 for SGDs 119-1 and 119-2, respectively, is removed. That is, the remaining portion of material 150 (e.g., the portion of material 150 adjacent the portions of continuous channels 148-1 and 148-2 for strings 109-1 and 109-2, respectively, and SGSs 113-1 and 113-2, respectively) is not removed, as illustrated in FIG. 1D. As such, the bottom of opening 152 is located below SGDs 119-1 and 119-2, and above the top memory cell of strings 109-1 and 109-2 (e.g., above memory cells 111 and 112).

Figure 1E:
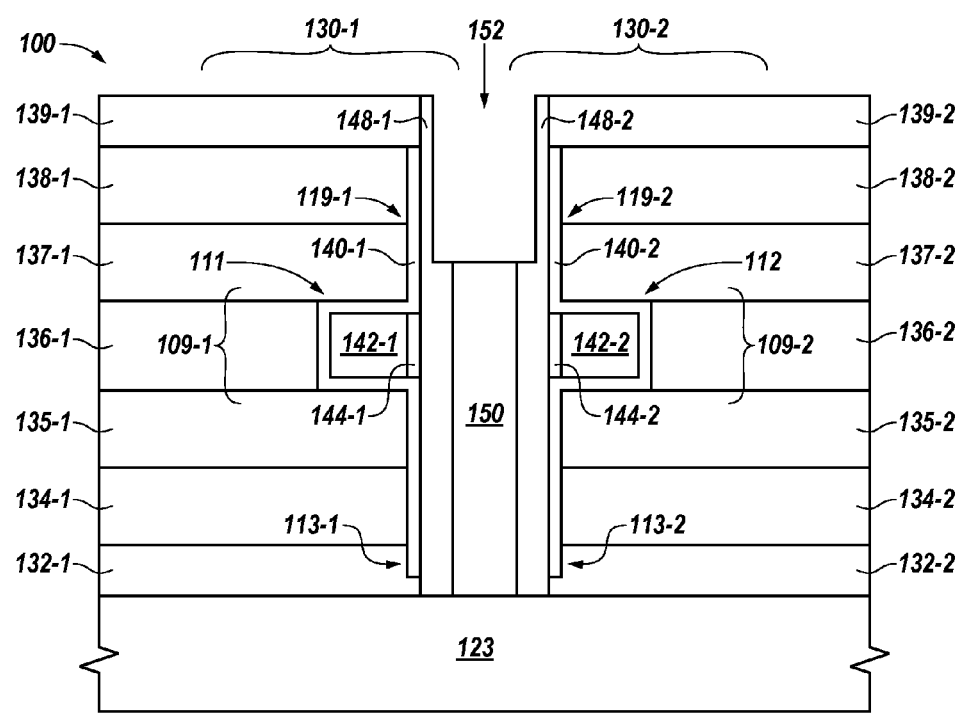

FIG. 1E illustrates a schematic cross-sectional view of the structure shown in FIG. 1D after a subsequent processing step. In FIG. 1E, a portion of the continuous channel 148-1 for SGD 119-1 (e.g., the portion adjacent opening 152) is removed, and a portion of the continuous channel 148-2 for SGD 119-2 (e.g., the portion adjacent opening 152) is removed. However, no portion of continuous channel 148-1 for string 109-1 or SGS 113-1 is removed, and no portion of continuous channel 148-2 for string 109-2 or SGS 113-2 is removed, as illustrated in FIG. 1E. Rather, only portions of continuous channels 148-1 and 148-2 for SGDs 119-1 and 119-2, respectively, are removed. As such, the continuous channel 148-1 for SGD 119-1 is thinner than the continuous channel 148-1 for string 109-1 and SGS 113-1, and the continuous channel 148-2 for SGD 119-2 is thinner than the continuous channel 148-2 for string 109-2 and SGS 113-2, as illustrated in FIG. 1E.

The portions of continuous channels 148-1 and 148-2 for SGDs 119-1 and 119-2, respectively, can be removed using, for example, a diluted TMAH solution. As an additional example, the portions of continuous channels 148-1 and 148-2 for SGDs 119-1 and 119-2, respectively, can be removed using a dry etch, such as a chemical dry etch, an isotropic dry etch, or a buffered oxide etch. As an additional example, continuous channels 148-1 and 148-2 for SGDs 119-1 and 119-2, respectively, can be partially consumed (e.g., thinned down) by oxidizing those portions of continuous channels 148-1 and 148-2, which can further densify the remaining portions of continuous channels 148-1 and 148-2. The oxidation can be, for example, a dry oxidation, a wet oxidation, or thermal oxidation.

In a number of embodiments, the portions of continuous channels 148-1 and 148-2 for SGDs 119-1 and 119-2, respectively (e.g., the thinner portions of continuous channels 148-1 and 148-2 illustrated in FIG. 1E) can be doped such that the doping concentration of continuous channel 148-1 is different (e.g., lower) for SGD 119-1 than for string 109-1 and SGS 113-1, and the doping concentration of continuous channel 148-2 is different (e.g., lower) for SGD 119-2 than for string 109-2 and SGS 113-2. The portions of continuous channels 148-1 and 148-2 for SGDs 119-1 and 119-2, respectively, can be doped using, for example, plasma assisted doping, such as boron doped plasma assisted doping.

Figure 1F:
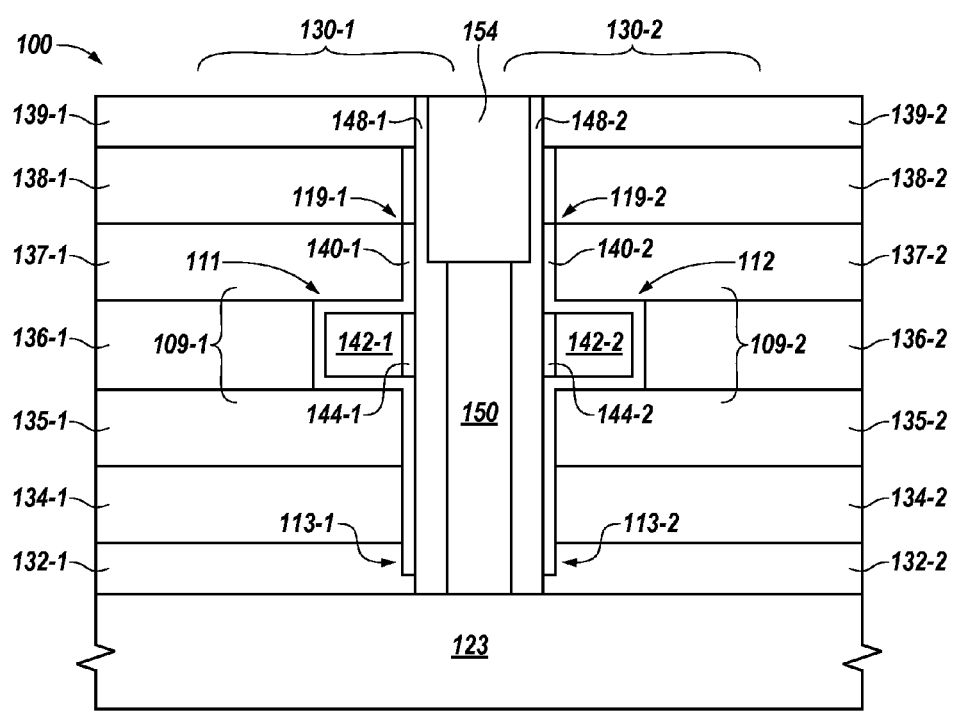

FIG. 1F illustrates a schematic cross-sectional view of the structure shown in FIG. 1E after a subsequent processing step. In FIG. 1F, material 154 is formed in opening 152 adjacent the portions of continuous channels 148-1 and 148-2 for SGDs 119-1 and 119-2, respectively (e.g., the thinner portions of continuous channels 148-1 and 148-2) and material 150 such that material 154 completely fills opening 152. As such, vertical stack 130-1 can include a portion of material 154 (e.g., the side of material 154 adjacent the portion of continuous channel 148-1), and vertical stack 130-2 can include a portion of material 154 (e.g., the side of material 154 adjacent the portion of continuous channel 148-2).

Material 154 can be, for example, a dielectric material such as a spin on dielectric (SOD) material, or an oxide material such as a flowable oxide material. In a number of embodiments, material 154 can be different than material 150. That is, in such embodiments, the portions of continuous channels 148-1 and 148-2 for SGDs 119-1 and 119-2, respectively can be adjacent opposite sides of a first material (e.g., 154), and the portions of continuous channels 148-1 and 148-2 for strings 109-1 and 109-2 and SGSs 113-1 and 113-2, respectively, can be adjacent opposite sides of a second material (e.g., 150). In a number of embodiments, material 154 can be the same as material 150. That is, in such embodiments, the continuous channel 148-1 for SGD 119-1, string 109-1, and SGS 113-1, and the continuous channel 148-2 for SGD 119-2, string 109-2, and SGS 113-2 can be adjacent opposite sides of a single material.

Figure 2A:
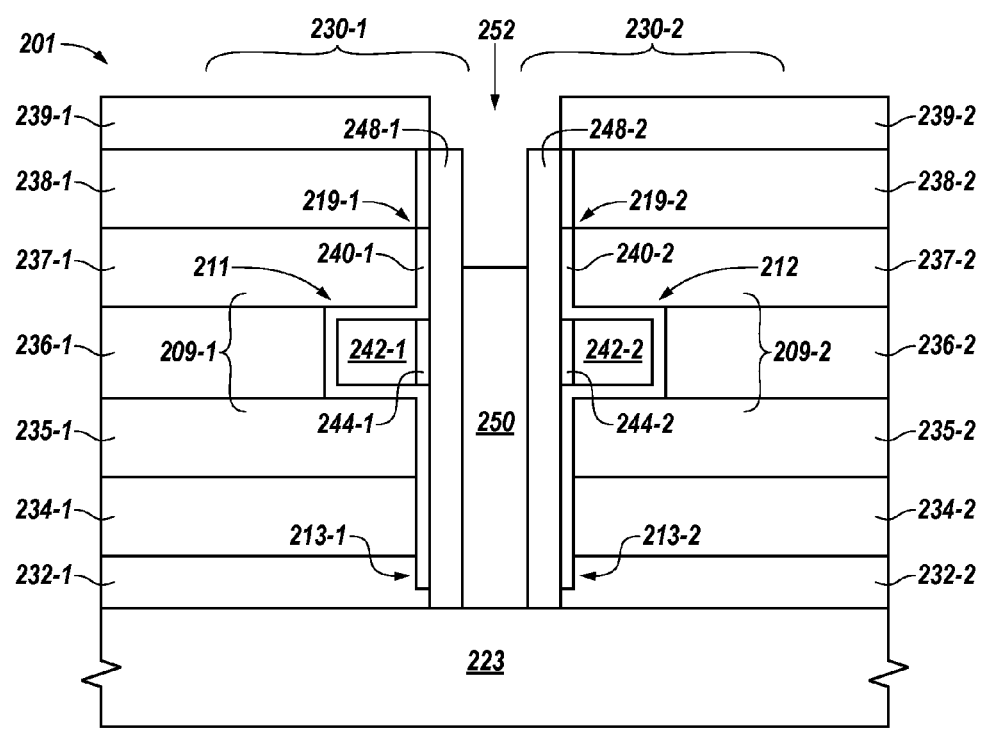
FIGS. 2A-2B illustrate process steps associated with forming an apparatus in the form of a memory device in accordance with a number of embodiments of the present disclosure.
Figure 2B:
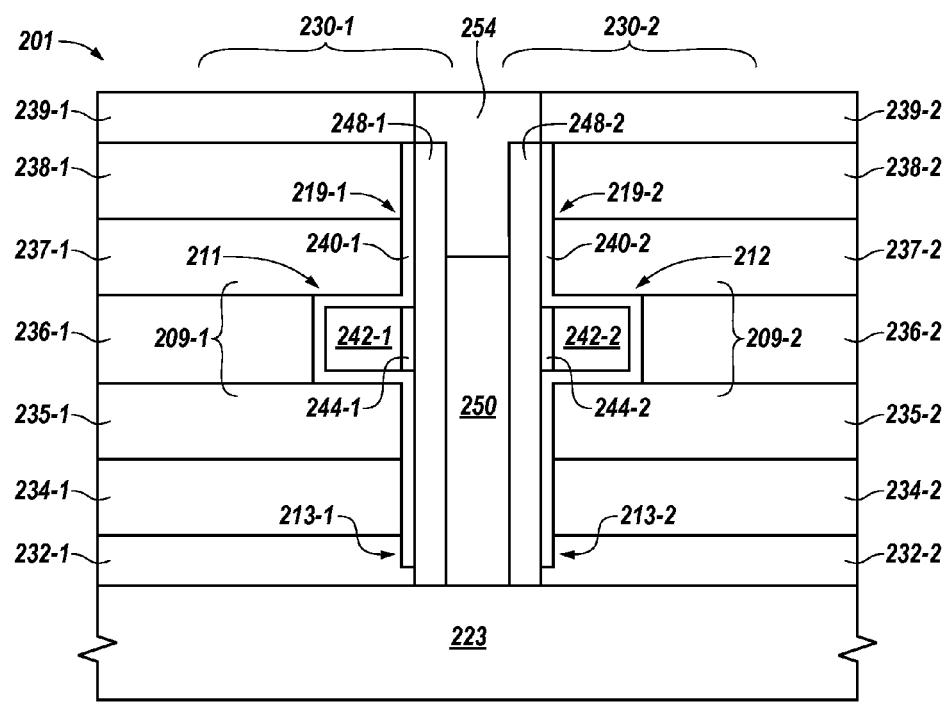

FIGS. 2A-2B illustrate process steps associated with forming an apparatus in the form of a memory device 201 in accordance with a number of embodiments of the present disclosure. FIG. 2A illustrates a schematic cross-sectional view of vertical stacks 230-1 and 230-2 formed (e.g., deposited) on a common source 223. Vertical stacks 230-1 and 230-2 illustrated in FIG. 2A can be analogous to vertical stacks 130-1 and 130-2 previously described in connection with FIG. 1D. That is, vertical stacks 230-1 and 230-2 may have undergone processing steps analogous to those described in connection with FIGS. 1A-1D.

For example, as shown in FIG. 2A, vertical stacks 230-1 and 230-2 include oxide materials 232-1 and 232-2, respectively, formed on common source 223, gate materials 234-1 and 234-2 formed on oxide materials 232-1 and 232-2, respectively, insulator materials 235-1 and 235-2 formed on gate materials 234-1 and 234-2, respectively, conductor materials 236-1 and 236-2 formed on insulator materials 235-1 and 235-2, respectively, insulator materials 237-1 and 237-2 formed on conductor materials 236-1 and 236-2, respectively, gate materials 238-1 and 238-2 formed on insulator materials 237-1 and 237-2, and cap materials 239-1 and 239-2 formed on gate materials 238-2 and 238-2, respectively, in a manner analogous to that previously described in connection with FIG. 1A. Further, as shown in FIG. 2A, vertical stacks 230-1 and 230-2 include oxide materials 240-1 and 240-2, respectively, formed adjacent oxide materials 232-1 and 232-2, gate materials 234-1 and 234-2, insulator materials 235-1 and 235-2, conductor materials 236-1 and 236-2, insulator materials 237-1 and 237-2, and gate materials 238-1, and 238-2, respectively, in a manner analogous to that previously described in connection with FIG. 1A. Further, as shown in FIG. 2A, vertical stacks 230-1 and 230-2 include control gate materials 242-1 and 242-2, respectively, and charge storage structure materials 244-1 and 244-2, respectively, in a manner analogous to that previously described in connection with FIG. 1A.

In the example illustrated in FIG. 2A, vertical stacks 230-1 and 230-2 can include memory cells 211 and 212, respectively, connected in series between SGSs 213-1 and 213-2 and SGDs 219-1 and 219-2, respectively, in a manner analogous to that previously described in connection with FIG. 1A. Memory cell 211 can be part of a string 209-1 of memory cells connected in series between SGS 213-1 and SGD 219-1, and memory cell 212 can be part of a string 209-2 of memory cells connected in series between SGS 213-2 and SGD 219-2, in a manner analogous to that previously described in connection with FIG. 1A.

As shown in FIG. 2A, vertical stack 230-1 includes a continuous channel 248-1 for SGS 213-1, string 209-1, and SGD 219-1, and vertical stack 230-2 includes a continuous channel 248-2 for SGS 213-2, string 209-2, and SGD 219-2, in a manner analogous to that previously described in connection with FIG. 1B. Further, as shown in FIG. 2A, vertical stacks 230-1 and 230-2 can include material 250 adjacent the portions of continuous channels 248-1 and 248-2, respectively, for strings 209-1 and 209-2 and SGSs 213-1 and 213-2, respectively, in a manner analogous to that previously described in connection with FIGS. 1C-1D. Further, as shown in FIG. 2A, vertical stacks 230-1 and 230-2 can include opening 252 adjacent the portions of continuous channels 248-1 and 248-2, respectively, for SGDs 219-1 and 219-2, respectively, in a manner analogous to that previously described in connection with FIG. 1D.

The portions of continuous channels 248-1 and 248-2 for SGDs 219-1 and 219-2, respectively (e.g., the portions of continuous channels 248-1 and 248-2 adjacent opening 252) can be doped such that the doping concentration of continuous channel 248-1 is different (e.g., lower) for SGD 219-1 than for string 209-1 and SGS 213-1, and the doping concentration of continuous channel 248-2 is different (e.g., lower) for SGD 219-2 than for string 209-2 and SGS 213-2. The portions of continuous channels 248-1 and 248-2 for SGDs 219-1 and 219-2, respectively, can be doped using, for example, plasma assisted doping, such as boron doped plasma assisted doping.

FIG. 2B illustrates a schematic cross-sectional view of the structure shown in FIG. 2A after a subsequent processing step. In FIG. 2B, material 254 is formed in opening 252 adjacent the portions of continuous channels 248-1 and 248-2 for SGDs 219-1 and 219-2, respectively (e.g., the doped portions of continuous channels 248-1 and 248-2) and material 250 such that material 254 completely fills opening 252. As such, vertical stack 230-1 can include a portion of material 254 (e.g., the side of material 254 adjacent the portion of continuous channel 248-1), and vertical stack 230-2 can include a portion of material 254 (e.g., the side of material 254 adjacent the portion of continuous channel 248-2).

Material 254 can be, for example, a dielectric material such as a spin on dielectric (SOD) material, or an oxide material such as a flowable oxide material. Material 254 can be different than material 250, or material 254 can be the same as material 250, in a manner analogous to that previously described in connection with FIG. 1F.

Figure 3:
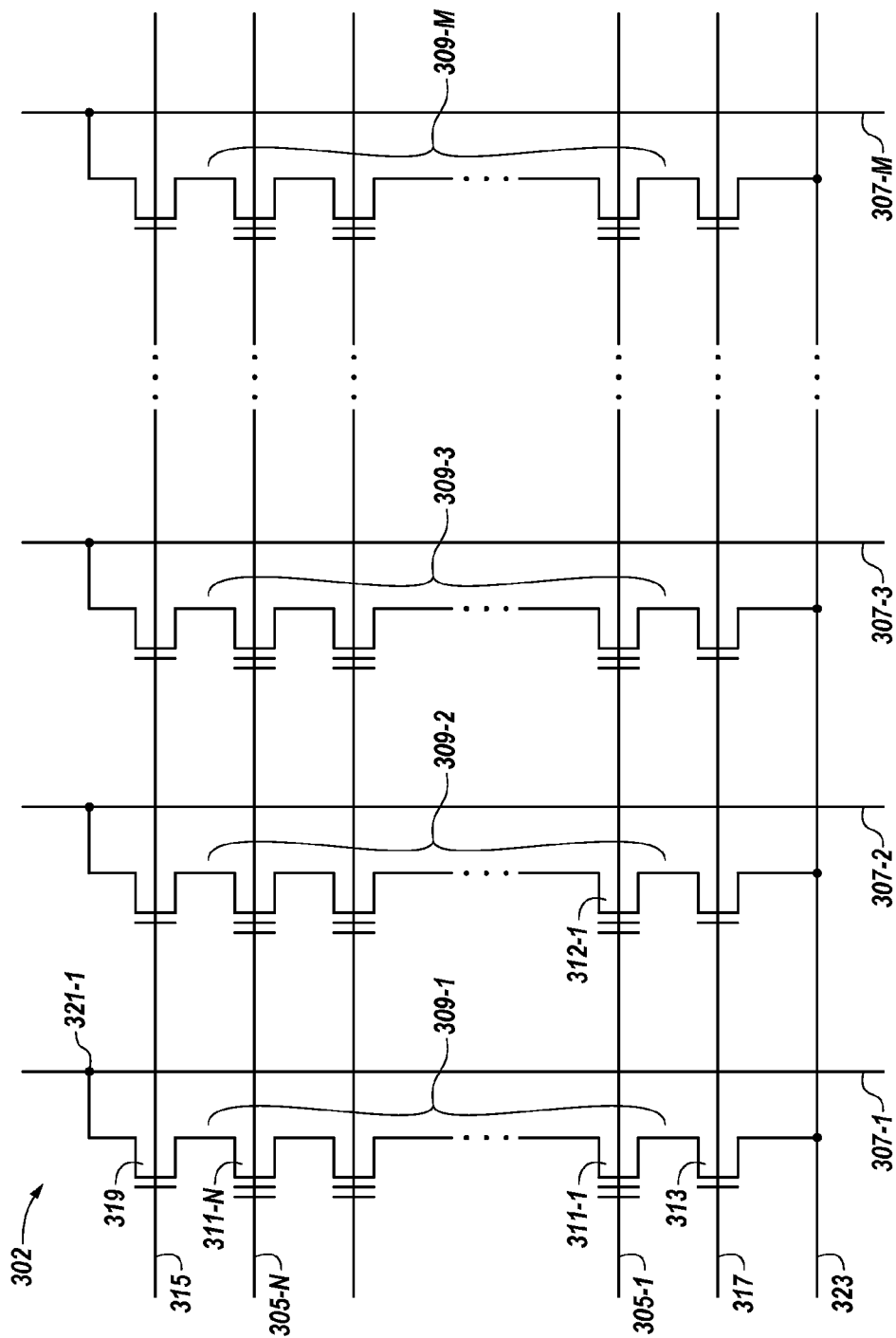
FIG. 3 illustrates a schematic diagram of a portion of a memory array in accordance with a number of embodiments of the present disclosure.

FIG. 3 illustrates a schematic diagram of a portion of a memory array 302 in accordance with a number of embodiments of the present disclosure. The embodiment of FIG. 3 illustrates a NAND architecture non-volatile memory array processed in accordance with a number of embodiments of the present disclosure.

As shown in FIG. 3, memory array 302 includes access lines (e.g., word lines 305-1, . . . , 305-N) and data lines (e.g., bit lines) 307-1, 307-2, 307-3, . . . , 307-M. For ease of addressing in the digital environment, the number of word lines 305-1, . . . , 305-N and the number of bit lines 307-1, 307-2, 307-3, . . . , 307-M can be some power of two (e.g., 256 word lines by 4,096 bit lines).

Memory array 302 includes NAND strings 309-1, 309-2, 309-3, . . . , 309-M. Each NAND string includes non-volatile memory cells 311-1, . . . , 311-N, each communicatively coupled to a respective word line 305-1, . . . , 305-N. Each NAND string (and its constituent memory cells) is also associated with a bit line 307-1, 307-2, 307-3, . . . , 307-M. The non-volatile memory cells 311-1, . . . , 311-N of each NAND string 309-1, 309-2, 309-3, . . . , 309-M are connected in series between a source select gate (SGS) (e.g., a field-effect transistor (FET)) 313, and a drain select gate (SGD) (e.g., FET) 319. Each source select gate 313 is configured to selectively couple a respective NAND string to a common source 323 responsive to a signal on source select line 317, while each drain select gate 319 is configured to selectively couple a respective NAND string to a respective bit line responsive to a signal on drain select line 315. The channel for each NAND string 309-1, 309-2, 309-3, . . . , and its corresponding SGS 313 and SGD 319 can be a continuous channel that is thinner for SGD 319 than for the string and SGS 313 and/or has a different doping concentration for SGD 319 than for the string and SGS 313, as previously described herein.

As shown in the embodiment illustrated in FIG. 3, a source of source select gate 313 is connected to a common source 323. The drain of source select gate 313 is connected to memory cell 311-1 of the corresponding NAND string 309-1. The drain of drain select gate 319 is connected to bit line 307-1 of the corresponding NAND string 309-1 at drain contact 321-1. The source of drain select gate 319 is connected to memory cell 311-N (e.g., a floating-gate transistor) of the corresponding NAND string 309-1.

In a number of embodiments, construction of non-volatile memory cells 311-1, . . . , 311-N includes a charge storage structure such as a floating gate (e.g., charge storage structure materials 144-1, 144-2, 244-1 and 244-2 previously described in connection with FIGS. 1A-1F and 2A-2B, respectively), and a control gate (e.g., control gate materials 142-1, 142-2, 242-1 and 242-2 previously described in connection with FIGS. 1A-1F and 2A-2B, respectively). Non-volatile memory cells 311-1, . . . , 311-N have their control gates coupled to a word line, 305-1, . . . , 305-N respectively. A "column" of the non-volatile memory cells, 311-1, . . . , 311-N, make up the NAND strings 309-1, 309-2, 309-3, . . . , 309-M, and are coupled to a given bit line 307-1, 307-2, 307-3, . . . , 307-M, respectively. A "row" of the non-volatile memory cells are those memory cells commonly coupled to a given word line 305-1, . . . , 305-N. The use of the terms "column" and "row" is not meant to imply a particular linear (e.g., vertical and/or horizontal) orientation of the non-volatile memory cells.

Subsets of cells coupled to a selected word line (e.g., 305-1, . . . , 305-N) can be programmed and/or sensed (e.g., read) together (e.g., at the same time). A program operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) data state.

A sense operation, such as a read or program verify operation, can include sensing a voltage and/or current change of a bit line coupled to a selected cell in order to determine the data state of the selected cell. The sense operation can include providing a voltage to (e.g., biasing) a bit line (e.g., bit line 107-1) associated with a selected memory cell above a voltage (e.g., bias voltage) provided to a source (e.g., source 123) associated with the selected memory cell. A sense operation could alternatively include precharging the bit line followed with discharge when a selected cell begins to conduct, and sensing the discharge.

Sensing the state of a selected cell can include providing a number of sensing signals to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the data state of the selected cell can be determined based on the current of the bit line corresponding to the selected cell. When the selected cell is in a conductive state, current flows between the source contact at one end of the string and a bit line contact at the other end of the string. As such, the current associated with sensing the selected cell is carried through each of the other cells in the string and the select transistors.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of processing memory, comprising:
    forming a vertical stack having memory cells connected in series between a source select gate and a drain select gate, wherein forming the vertical stack includes:
        forming a continuous channel for the source select gate, the memory cells, and the drain select gate; and
        removing a portion of the continuous channel for the drain select gate such that the continuous channel is thinner for the drain select gate than for the memory cells and the source select gate.

2. The method of claim 1, wherein forming the vertical stack includes doping the portion of the continuous channel for the drain select gate such that a doping concentration of the continuous channel is different for the drain select gate than for the memory cells and the source select gate.

3. The method of claim 1, wherein forming the vertical stack includes:
    forming the continuous channel such that the vertical stack includes an opening adjacent the continuous channel;
    forming a material in the opening adjacent the continuous channel; and removing a portion of the material in the opening adjacent the portion of the continuous channel for the drain select gate.

4. The method of claim 3, wherein forming the vertical stack includes removing the portion of the continuous channel for the drain select gate after removing the portion of the material in the opening adjacent the portion of the continuous channel for the drain select gate.

5. The method of claim 1, wherein forming the vertical stack includes removing the portion of the continuous channel for the drain select gate using a diluted tetramethylammonium hydroxide solution.

6. The method of claim 1, wherein forming the vertical stack includes removing the portion of the continuous channel for the drain select gate using a dry etch.

7. The method of claim 1, wherein the method includes partially consuming the continuous channel by oxidizing the portion of the continuous channel for the drain select gate.

8. A method of processing memory, comprising:
forming a vertical stack having a string of memory cells connected in series between a source select gate and a drain select gate, wherein forming the vertical stack includes:
forming a continuous channel for the source select gate, the string of memory cells, and the drain select gate; and
doping a portion of the continuous channel for the drain select gate such that a doping concentration of the continuous channel is different for the drain select gate than for the string of memory cells and the source select gate.

9. The method of claim 8, wherein the method includes concurrently forming the continuous channel for the source select gate, the string of memory cells, and the drain select gate.

10. The method of claim 8, wherein forming the continuous channel includes conformally forming the continuous channel for the source select gate, the string of memory cells, and the drain select gate.

11. The method of claim 8, wherein forming the vertical stack includes:
forming the continuous channel such that the vertical stack includes an opening adjacent the continuous channel;
filling the opening adjacent the continuous channel with a material;
removing only a portion of the material in the opening adjacent the portion of the continuous channel for the drain select gate; and
doping the portion of the continuous channel for the drain select gate after removing only the portion of the material in the opening adjacent the portion of the continuous channel for the drain select gate.

12. The method of claim 11, wherein the material is a dielectric material.

13. The method of claim 11, wherein the material is an oxide material.

14. The method of claim 11, wherein forming the vertical stack includes forming an additional material in the opening adjacent the portion of the continuous channel for the drain select gate after doping the portion of the continuous channel for the drain select gate.

15. The method of claim 8, wherein forming the vertical stack includes doping the portion of the continuous channel for the drain select gate using plasma assisted doping.

16. An apparatus, comprising:
a vertical stack having a string of memory cells connected in series between a source select gate and a drain select gate, wherein:
the vertical stack includes a continuous channel for the source select gate, the string of memory cells, and the drain select gate; and
the continuous channel is thinner for the drain select gate than for the string of memory cells and the source select gate.

17. The apparatus of claim 16, wherein the apparatus includes an additional vertical stack having an additional string of memory cells connected in series between an additional source select gate and an additional drain select gate, wherein:
the additional vertical stack includes an additional continuous channel for the additional source select gate, the additional string of memory cells, and the additional drain select gate; and
the additional continuous channel is thinner for the additional drain select gate than for the additional string of memory cells and the additional source select gate.

18. The apparatus of claim 17, wherein the continuous channel and the additional continuous channel are adjacent opposite sides of a single material.

19. The apparatus of claim 17, wherein:
the continuous channel for the drain select gate and the additional continuous channel for the additional drain select gate are adjacent opposite sides of a first material; and
the continuous channel for the string of memory cells and the source select gate and the additional continuous channel for the additional string of memory cells and the additional source select gate are adjacent opposite sides of a second material.

20. An apparatus, comprising:
a vertical stack having memory cells connected in series between a source select gate and a drain select gate, wherein:
the vertical stack includes a continuous channel for the source select gate, the memory cells, and the drain select gate; and
a doping concentration of the continuous channel is different for the drain select gate than for the memory cells and the source select gate.

21. The apparatus of claim 20, wherein the continuous channel is thinner for the drain select gate than for the memory cells and the source select gate.

22. The apparatus of claim 20, wherein the doping concentration of the continuous channel is lower for the drain select gate than for the memory cells and the source select gate.

23. The apparatus of claim 20, wherein the continuous channel is hollow.

24. The apparatus of claim 20, wherein the continuous channel is solid.

* * * * *